(12) United States Patent
Takami

(10) Patent No.: US 7,897,461 B2
(45) Date of Patent: Mar. 1, 2011

(54) SEMICONDUCTOR DEVICE AND METHOD FOR FABRICATING THE SAME

(75) Inventor: Yoshinori Takami, Kyoto (JP)

(73) Assignee: Panasonic Corporation, Osaka (JP)

( * ) Notice: Subject to any disclaimer, the term of this patent is extended or adjusted under 35 U.S.C. 154(b) by 395 days.

(21) Appl. No.: 12/207,892

(22) Filed: Sep. 10, 2008

(65) Prior Publication Data

US 2009/0078994 A1 Mar. 26, 2009

(30) Foreign Application Priority Data

Sep. 21, 2007 (JP) .................................. 2007-245184

(51) Int. Cl.
*H01L 21/336* (2006.01)
*H01L 29/76* (2006.01)

(52) U.S. Cl. ......................................... 438/270; 257/330

(58) Field of Classification Search .................. 438/259, 438/589, 270–273; 257/329–331, E29.138–E29.148
See application file for complete search history.

(56) References Cited

U.S. PATENT DOCUMENTS

| 4,663,644 A | 5/1987 | Shimizu |
| 6,060,747 A * | 5/2000 | Okumura et al. ............. 257/331 |
| 7,075,147 B2 * | 7/2006 | Cao ............................... 257/331 |
| 2007/0007588 A1 | 1/2007 | Ishida et al. |

FOREIGN PATENT DOCUMENTS

| JP | 61-161766 | 7/1986 |
| JP | 62-126674 | 6/1987 |
| JP | 2005-045123 | 2/2005 |

* cited by examiner

*Primary Examiner* — Calvin Lee
(74) *Attorney, Agent, or Firm* — McDermott Will & Emery LLP

(57) ABSTRACT

Disclosed is a semiconductor device having an n-type drain region, a low concentration p-type body region formed on the n-type drain region, an n-type source region formed on the low concentration p-type body region, a high concentration p-type body region formed on the low concentration p-type body region, a gate insulating film, and a gate electrode, wherein a plurality of trenches T which extend in a same direction and each of which forms a continuous concavo-convex shape when viewed from above are formed from top faces of the source region and the high concentration body region and pass through the low concentration body region to reach into the drain region, and wherein the gate electrode is buried in each of the plurality of trenches. A maximum distance between two adjacent trenches T of the n-type source region is greater than a maximum distance between the two adjacent trenches T of the high concentration p-type body region.

8 Claims, 7 Drawing Sheets

SEMICONDUCTOR DEVICE AND METHOD FOR FABRICATING THE SAME

BACKGROUND OF THE INVENTION

1. Field of the Invention

The present invention relates to a semiconductor device having a trench MOS (Metal Oxide Semiconductor) gate structure and a method for fabricating the same.

2. Description of Related Art

A trench MOS gate structure, in which a trench (groove) is formed in a semiconductor substrate and a gate oxide film and a gate electrode are formed in the trench, has been employed in semiconductor devices such as a power MOSFET (Field Effect Transistor) or the like and is widely used for a DC-DC converter, load switch, or the like of electronics equipment. With the recent trend of low power consumption and high speed of electronic equipment, demand for decrease in on-resistance of a MOSFET used in the equipment is growing.

An example of a MOSFET which has a trench MOS gate structure designed for reducing on-resistance is disclosed, for example, in Japanese Laid-Open Patent Publication No. 2005-45123. FIG. 9A is a plan view of a conventional semiconductor device. FIG. 9B and FIG. 9C are cross sections taken along the line IXb-IXb and the line IXc-IXc, respectively, of the semiconductor device of FIG. 9A.

As shown in FIG. 9A through FIG. 9C, a conventional semiconductor device includes: a low concentration p-type body region 103 formed on an n-type drain region 102a; an n-type source region 104 and a high concentration p-type body region 105, both formed on the low concentration p-type body region 103; a plurality of trenches T arranged in stripes and each being formed from top faces of the n-type source region 104 and the high concentration p-type body region 105 and passing through the n-type source region 104, the high concentration p-type body region 105, and the low concentration p-type body region 103 to reach into the n-type drain region 102a; a gate insulating film 106 formed along an inner face of each trench T; a gate electrode 107 buried in each trench T; an insulating film 108 (not shown in FIG. 9A) formed on the gate electrode 107 in each trench T; a source electrode (not shown) formed on the n-type source region 104, high concentration p-type body region 105, and insulating film 108; and a drain electrode (not shown) formed under the n-type drain region 102a. The n-type drain region 102a is composed of a high concentration n-type drain region 101, which is made of a silicon substrate, and a low concentration n-type drain region 102.

As above, by arranging the trenches in stripes to reduce trench width and increasing the density of transistors per unit area by decreasing the distance between trenches located next to each other with the n-type source region 104 and the high concentration p-type body region 105 interposed therebetween to increase channel width, it is possible to reduce on-resistance.

SUMMARY OF THE INVENTION

However, problems such as mentioned below will occur in the above structure if miniaturization proceeds and the distance between trenches is reduced.

As known from FIG. 9B, a MOSFET having a trench MOS gate structure includes a parasitic bipolar transistor having the n-type source region 104 as an emitter, the low concentration p-type body region 103 as a base, and the n-type drain region 102a as a collector. This parasitic bipolar transistor is turned on when the electric potential of the low concentration p-type body region 103 as a base becomes low. If the parasitic bipolar transistor is turned on due to a surge voltage, the parasitic bipolar transistor generates heat and the current increases, which leads the device to thermal breakdown.

FIG. 10 is a simulation result showing a minimum electric potential of the low concentration p-type body region 103 located directly under the n-type source region 104 in relation to a distance between trenches, under the conditions of a gate voltage of 2 V and a drain voltage of 0 V. As the figure clearly shows, the electric potential of the low concentration p-type body region 103 becomes low as a distance between trenches is reduced. This is because the low concentration p-type body region 103 is more likely to be influenced by the gate voltage as a distance between trenches is reduced. For this reason, the parasitic bipolar transistor is more easily turned on as the distance between trenches is reduced. As a result, breakdown resistance is deteriorated.

FIG. 11 is a simulation result showing the relationship between the distance between trenches and a threshold voltage Vt in a conventional trench MOS gate structure. As the figure clearly shows, the threshold voltage Vt decreases as the distance between trenches is reduced. This is because the electric potential of the low concentration p-type body region 103 becomes low as the distance between trenches is reduced, as mentioned above.

As explained, the semiconductor devices having a conventional structure, such as those in FIG. 9A through FIG. 9C, have the following problems: as miniaturization proceeds and a distance between trenches located next to each other with the n-type source region 104 and the high concentration p-type body region 105 interposed therebetween is reduced, the low concentration p-type body region 103 is more likely to be influenced by a gate voltage; the electric potential of the low concentration p-type body region 103 is more likely to be lowered; a parasitic bipolar transistor is more easily turned on; and resistance to breakdown that is caused by the surge voltage is deteriorated. Another problem is that a threshold voltage Vt is lowered by the reduction of the electric potential of the low concentration p-type body region 103.

An object of the present invention is to provide a semiconductor device having a trench gate structure and a method for fabricating the same, in which even if the structure is miniaturized, the electric potential of the low concentration p-type body region is stabilized and breakdown resistance is increased, and at the same time, decrease of a threshold voltage Vt is suppressed.

To achieve the above object, a semiconductor device of the present invention includes: a drain region of a first conductivity type; a low concentration body region of a second conductivity type formed on the drain region; a source region of a first conductivity type formed on the low concentration body region; a high concentration body region formed on the low concentration body region and containing a second conductivity type impurity whose concentration is higher than that of the low concentration body region; a gate insulating film; and a gate electrode formed on the gate insulating film, wherein a plurality of trenches which extend in a same direction and each of which forms a continuous concavo-convex shape when viewed from above are formed from top faces of the source region and the high concentration body region and pass through the low concentration body region to reach into the drain region; the gate insulating film covers an inner surface of each of the plurality of trenches; the gate electrode is buried in each of the plurality of trenches; and a maximum distance between two adjacent trenches of the source region is greater than a maximum distance between the two adjacent trenches of the high concentration body region.

Owing to this structure in which a distance between trenches of the source region is great, the electric potential of the low concentration body region located under the source region is not easily lowered even if the structure is miniaturized. As a result, a parasitic bipolar transistor is prevented from being turned on and resistance to breakdown that is caused by a surge voltage is increased. Moreover, decrease of a threshold voltage is suppressed and the degree of freedom of a control range of the threshold voltage is increased.

Further, by sandwiching a trench between the source region and the high concentration body region, resistance to breakdown that is caused by a surge voltage is increased even if the total area of the source region and the high concentration body region is equal to the total area of those of a conventional semiconductor device.

A method for fabricating the semiconductor device of the present invention includes the steps of: (a) forming a low concentration body region of a second conductivity type on a drain region of a first conductivity type; (b) forming a plurality of trenches which extend in a same direction and each of which forms a continuous concavo-convex shape when viewed from above and passes through the low concentration body region to reach into the drain region; (c) forming a gate electrode in each of the plurality of trenches; and (d) forming in an upper part of the low concentration body region a source region of a first conductivity type and a high concentration body region containing a second conductivity type impurity whose concentration is higher than that of the low concentration body region.

A trench according to this method has a concavo-convex shape when viewed from above. Hence, it is possible to increase a distance between trenches of the source region than a distance between trenches of the high concentration body region. As a result, it is possible to form a semiconductor device in which a low concentration body region is less likely to be influenced by a gate voltage and resistance to breakdown that is caused by the surge voltage is increased.

As explained, according to a semiconductor device of the present invention and a method for fabricating the same, it is possible to provide a semiconductor device having a trench gate structure in which, even if the structure is miniaturized, the electric potential of the low concentration body region is stabilized and breakdown resistance is increased, and at the same time, decrease of a threshold voltage Vt is suppressed.

Figure 3A:
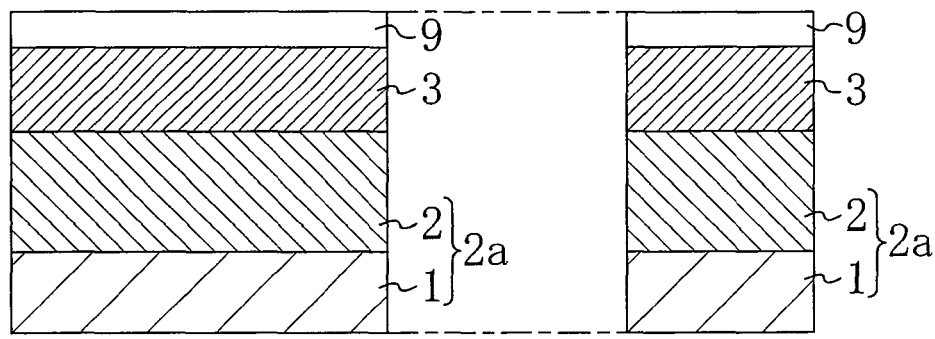
Figure 3B:
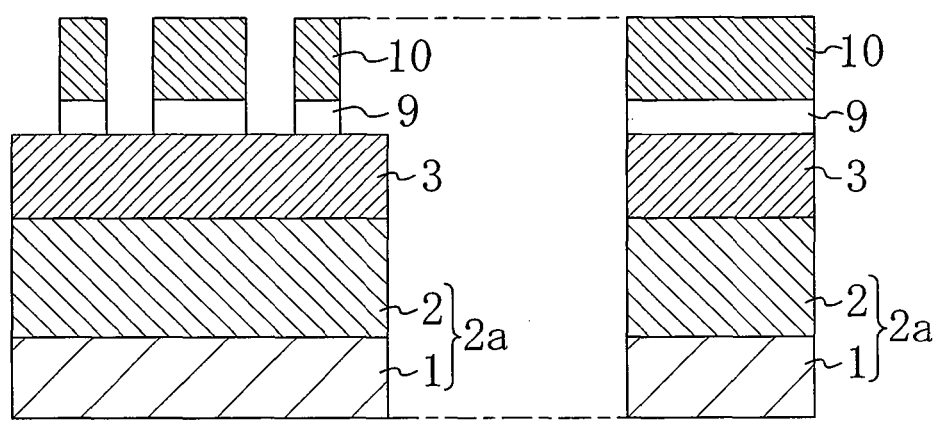
Figure 3C:
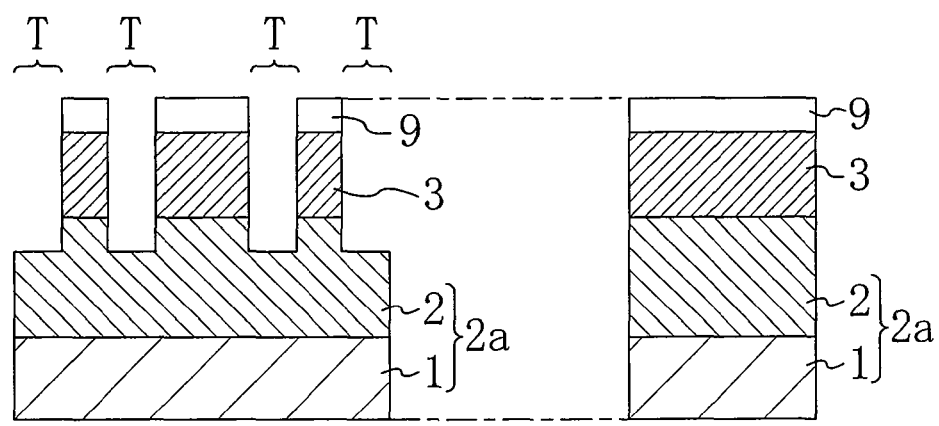

Each of FIG. 3A through FIG. 3C is a cross section showing a step included in a method for fabricating the semiconductor device according to the first embodiment of the present invention.

Figure 4A:
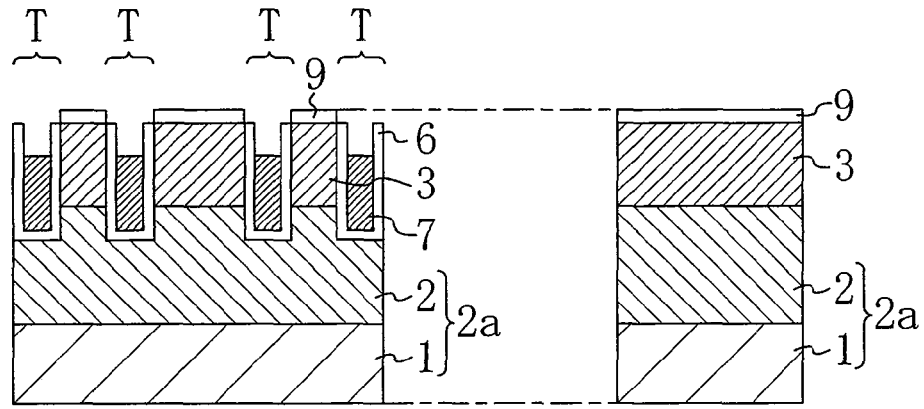
Figure 4B:
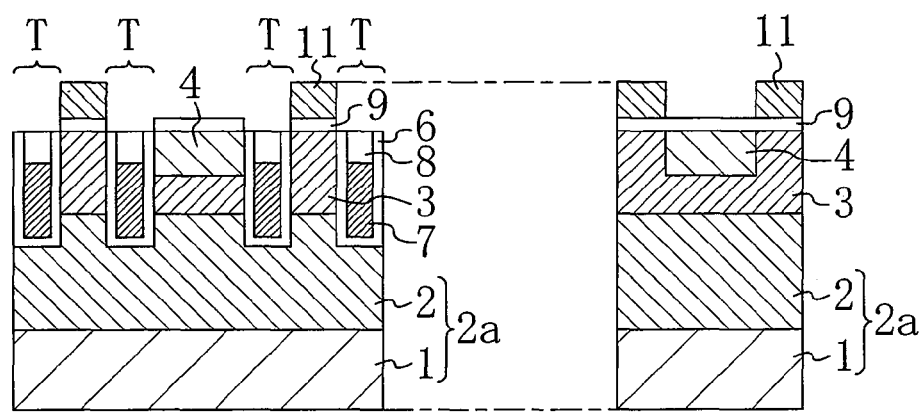
Figure 4C:
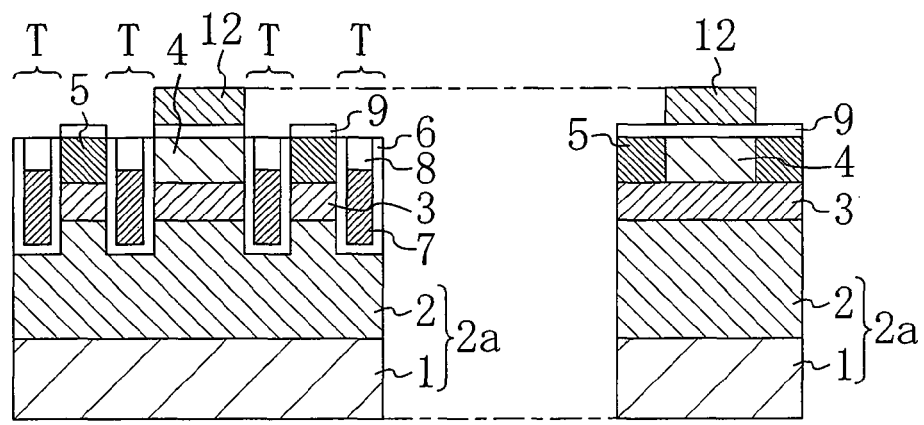

Each of FIG. 4A through FIG. 4C is a cross section showing a step included in a method for fabricating the semiconductor device according to the first embodiment of the present invention.

Figure 5:
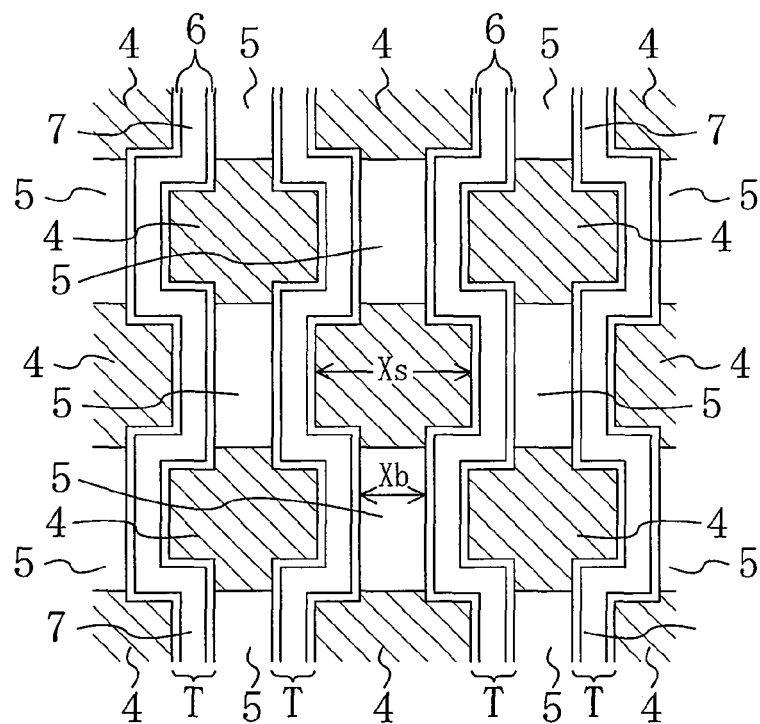

FIG. 5 is a plan view of a semiconductor device according to the first modification of the first embodiment.

Figure 6:
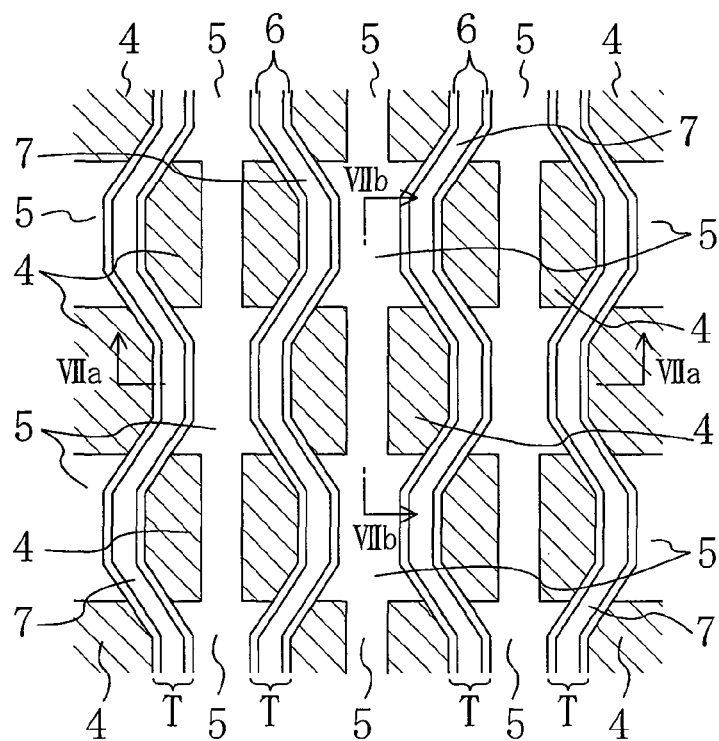

FIG. 6 is a plan view of a semiconductor device according to the second modification of the first embodiment.

Figure 7A:
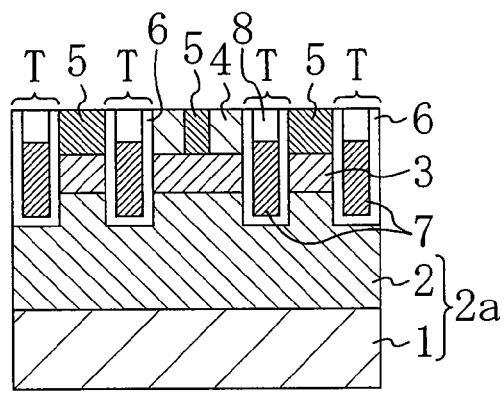
Figure 7B:
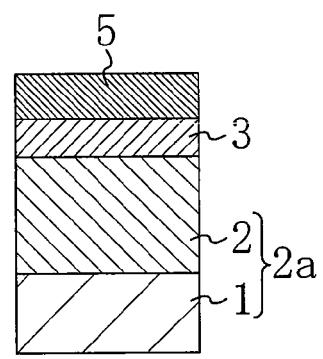

FIG. 7A and FIG. 7B show cross sections taken along the line VIIa-VIIa and the line VIIb-VIIb, respectively, of the semiconductor device of FIG. 6.

Figure 8:
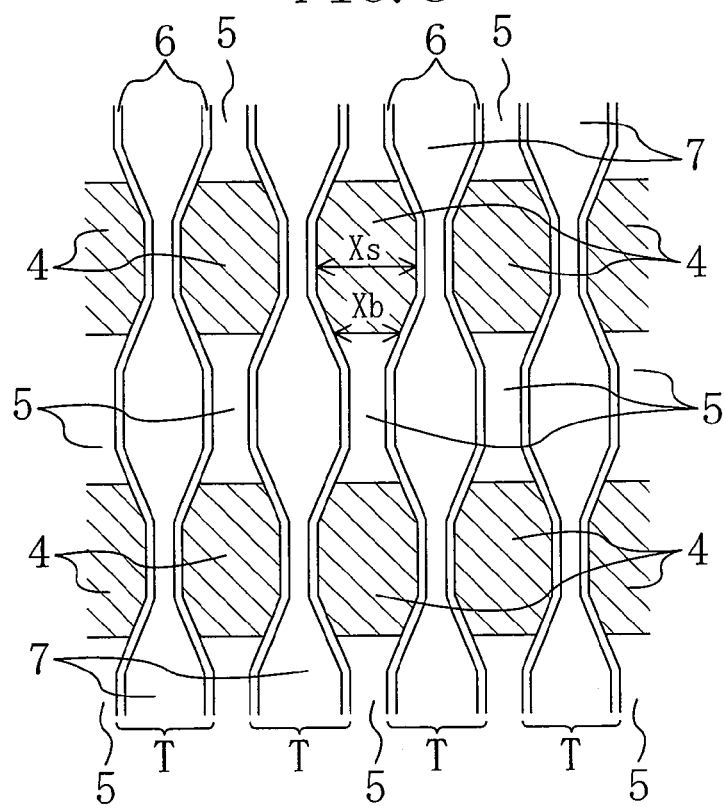

FIG. 8 is a plan view of a semiconductor device according to the second embodiment of the present invention.

Figure 9A:
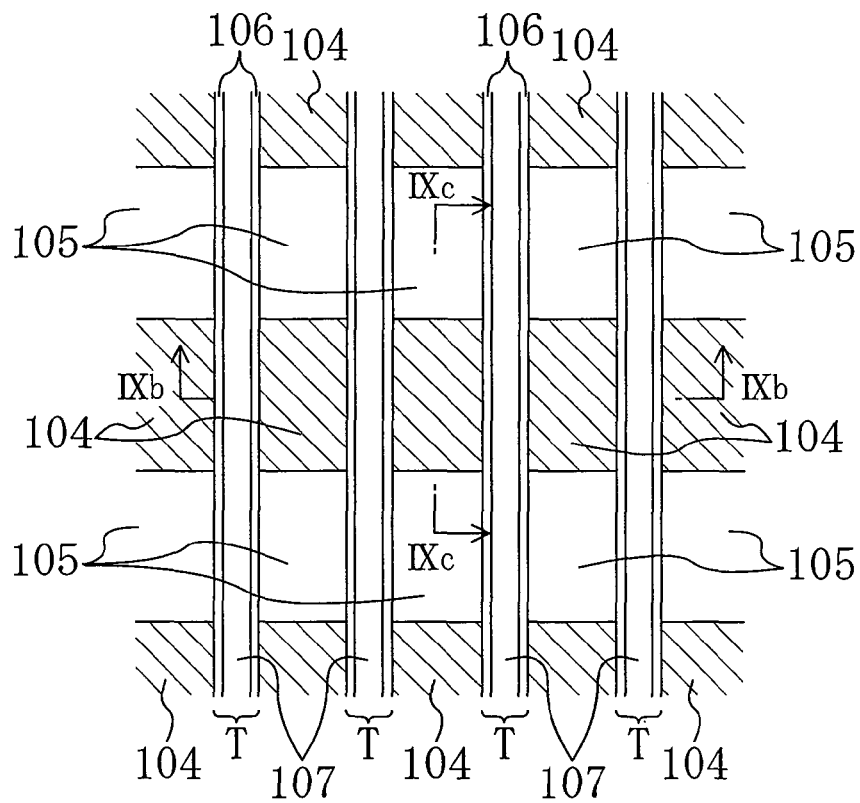
Figure 9B:
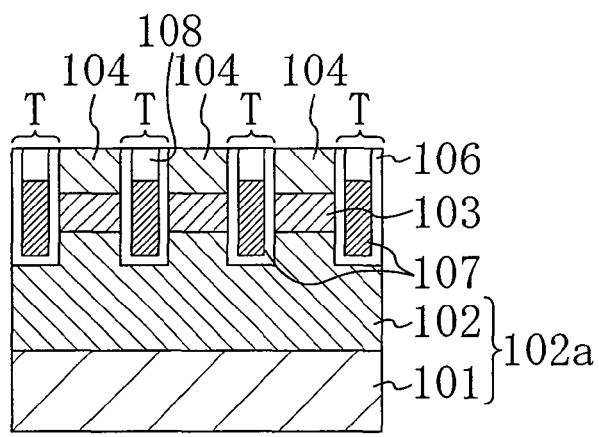
Figure 9C:
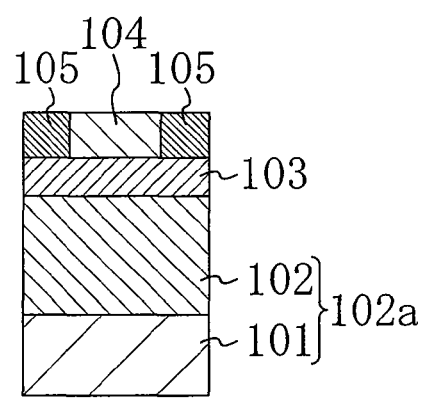

FIG. 9A is a plan view of a conventional semiconductor device. FIGS. 9B and 9C show cross sections taken along the line IXb-IXb and the line IXc-IXc, respectively, of the semiconductor device of FIG. 9A.

Figure 10:
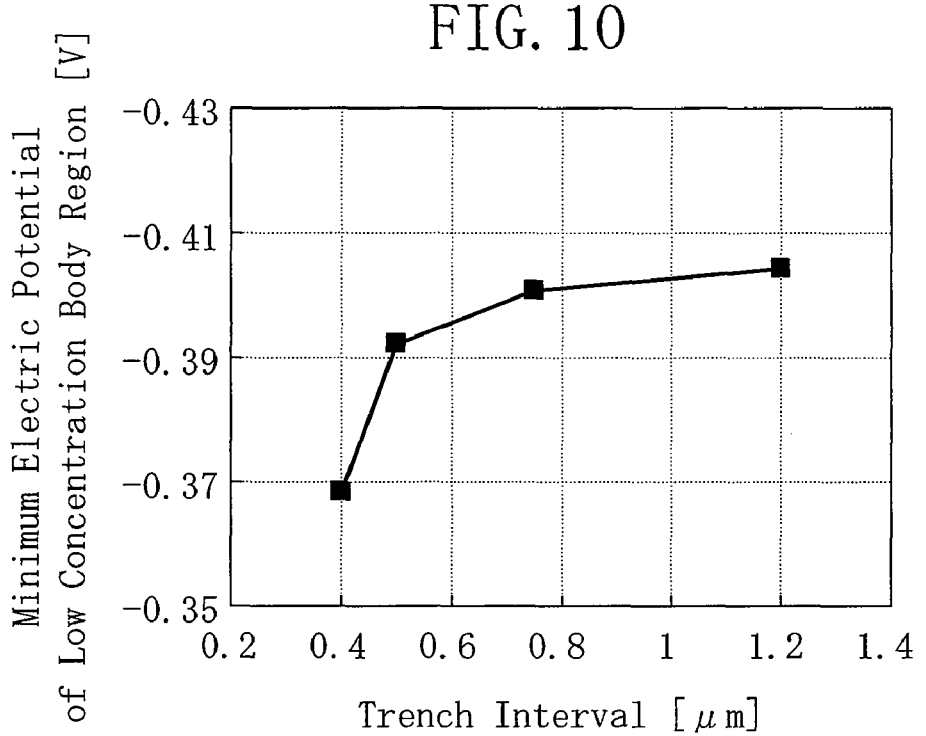

FIG. 10 is a simulation result showing a minimum electric potential of a low concentration p-type body region located directly under an n-type source region in relation to a distance between trenches.

Figure 11:
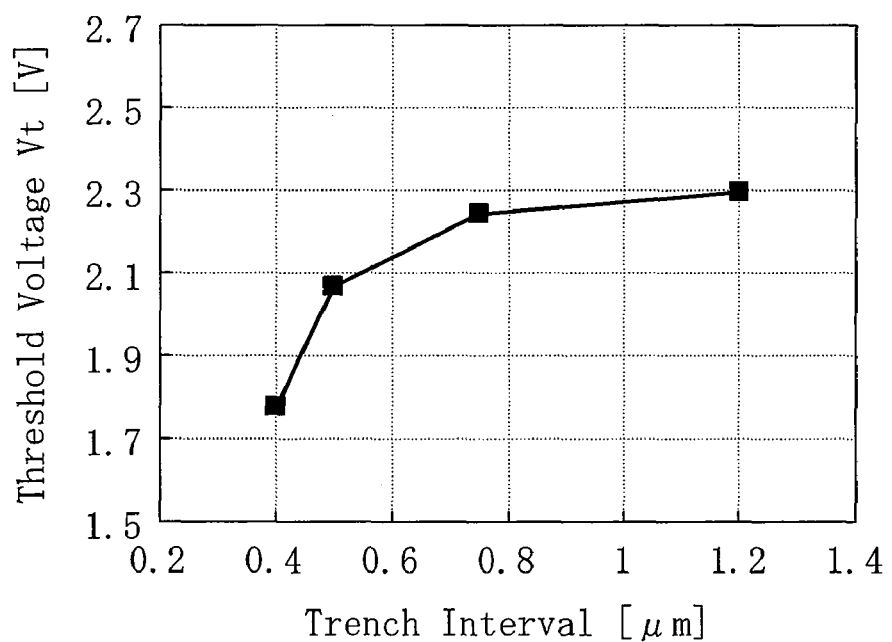

FIG. 11 is a simulation result showing the relationship between a distance between trenches and a threshold voltage Vt in a conventional trench MOS gate structure.

DESCRIPTION OF THE PREFERRED EMBODIMENTS

Embodiment 1

1. Structure of Semiconductor Device

Figure 1:
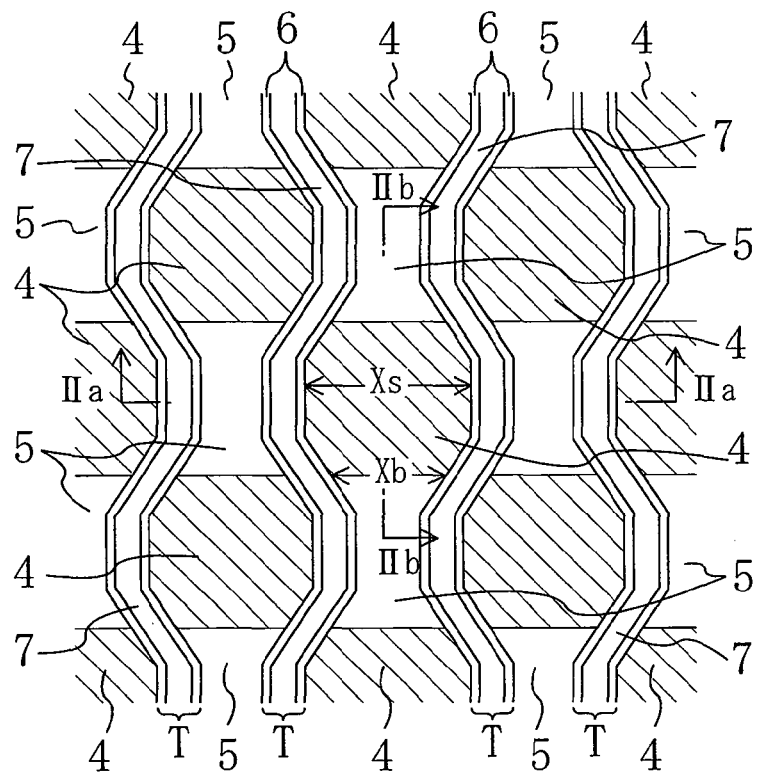
FIG. 1 is a plan view of a semiconductor device having a trench gate structure according to the first embodiment of the present invention.
Figure 2A:
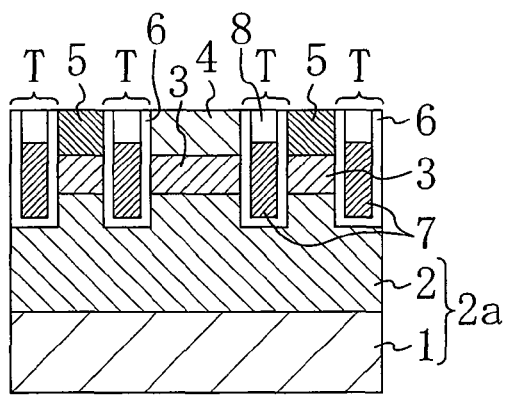
FIG. 2A and FIG. 2B show cross sections taken along the line IIa-IIa and the line IIb-IIb, respectively, of the semiconductor device of FIG. 1.
Figure 2B:
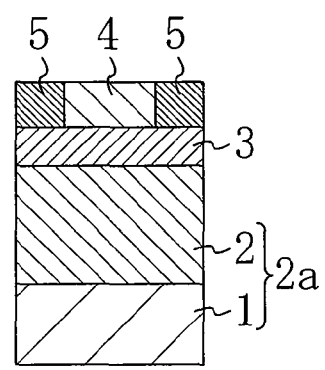

FIG. 1 is a plan view of a semiconductor device having a trench gate structure according to the first embodiment of the present invention. FIG. 2A and FIG. 2B show cross sections taken along the line IIa-IIa and the line IIb-IIb, respectively, of the semiconductor device of FIG. 1. The insulating film 8 shown in FIG. 2A is omitted from FIG. 1 for better viewing of the structure.

As shown in FIG. 1, FIG. 2A and FIG. 2B, a semiconductor device of the present embodiment includes: a low concentration p-type body region 3 formed on an n-type drain region 2a; an n-type source region 4 and a high concentration p-type body region 5, both being formed on the low concentration p-type body region 3; a plurality of trenches T each of which is formed from top faces of the n-type source region 4 and the high concentration p-type body region 5 and passes through the n-type source region 4, the high concentration p-type body region 5, and the low concentration p-type body region 3 to reach into the n-type drain region 2a; a gate insulating film 6 formed along an inner face of each trench T; a gate electrode 7 buried in each trench T; an insulating film 8 formed on the gate electrode 7 in each trench T; a source electrode (not shown) formed on the n-type source region 4, the high concentration p-type body region 5, and the insulating film 8; and a drain electrode (not shown) formed under the n-type drain region 2a. The n-type drain region 2a is composed of a high concentration n-type drain region 1, which is made of a silicon substrate (semiconductor substrate), and a low concentration n-type drain region 2. All of the n-type drain region 2a, the low concentration p-type body region 3, the n-type source region 4, and the high concentration p-type body region 5 are formed in a semiconductor region.

A semiconductor device of the present embodiment differs from a conventional semiconductor device in that the plurality of trenches T and the gate electrodes 7 formed in the trenches T extend in a same direction while forming a continuous concavo-convex shape when viewed from above. In addition, the maximum value Xs of the distance between two adjacent trenches T (trench interval) of the n-type source region 4 is greater than the maximum value Xb of the distance between the two adjacent trenches T of the high concentration p-type body region 5. Further, according to the semiconductor device of the present embodiment, two gate electrodes 7 (and trenches T) arranged next to each other with the n-type source region 4 and the high concentration p-type body region 5 interposed therebetween are symmetric with respect to an axis that is parallel to a direction in which the gate electrode 7 extends.

Furthermore, according to the semiconductor device of the present embodiment, the high concentration p-type body region 5 and the n-type source region 4 are arranged alternately in the direction in which the gate electrode 7 extends, and the high concentration p-type body region 5 and the n-type source region 4 are arranged such that the gate electrode 7 (and trench T) is sandwiched between the concentration p-type body region 5 and the n-type source region 4.

According to this structure, it is possible to increase the distance between two adjacent trenches of the n-type source region 4 even if the total area of the n-type source region 4 and the high concentration p-type body region 5 of the semiconductor device is equal to the total area of those of a conventional structure shown in FIG. 9. It is therefore also possible to increase a trench interval Xs in the low concentration p-type body region 3 that is located directly under the n-type source region 4. Owing to this structure, influence of a gate voltage on the low concentration p-type body region 3 is suppressed and reduction of the electric potential of the low concentration p-type body region 3 is suppressed. As a result, a parasitic bipolar transistor is prevented from being turned on and resistance to breakdown that is caused by a surge voltage is increased. Moreover, the electric potential of the low concentration p-type body region 3 is prevented from being lowered for the same reason as above, and therefore, decrease in a threshold voltage Vt is suppressed. As a result, it becomes possible to increase the degree of freedom of a control range of the threshold voltage. Moreover, since the trenches T are formed such that each trench T forms a continuous concavo-convex shape when viewed from above the semiconductor substrate, channel width is increased and on-resistance is decreased. In addition, because a width of the low concentration p-type body region 3 located under the n-type source region 4 (a width in a direction orthogonal to the direction in which each gate electrode 7 extends) is greater than that of a conventional semiconductor device, a resistance value of the low concentration p-type body region 3 located under the n-type source region 4 is lowered. As a result, a parasitic bipolar transistor is prevented from being turned on and resistance to breakdown that is caused by a surge voltage is increased. Since a width of the n-type source region 4 (a width in a direction orthogonal to the direction in which each gate electrode 7 extends) is greater than that of a conventional semiconductor device, a resistance value of the n-type source region 4 is also lowered and on-resistance is also decreased.

2. Method for Fabricating Semiconductor Device

A method for fabricating a semiconductor device having a trench gate structure according to the first embodiment of the present invention will hereinafter be described using the drawings.

Each of FIG. 3A through FIG. 3C and FIG. 4A through FIG. 4C is a cross section showing a step included in a method for fabricating the semiconductor device according to the first embodiment of the present invention. The drawing on the left of each of FIG. 3A through FIG. 3C and FIG. 4A through FIG. 4C is a cross section taken along the line IIa-IIa of FIG. 1, as is the case with FIG. 2A, and the drawing on the right of each of FIG. 3A through FIG. 3C and FIG. 4A through FIG. 4C is a cross section taken along the line IIb-IIb of FIG. 1, as is the case with FIG. 2B.

As shown in FIG. 3A, an n-type drain region 2a is composed of a high concentration n-type drain region 1 and a low concentration n-type drain region 2. The high concentration n-type drain region 1 is made of a silicon substrate (semiconductor substrate) of which impurity concentration is approximately $3 \times 10^{19}$ $cm^{-3}$. The low concentration n-type drain region 2 of which impurity concentration is approximately $1 \times 10^{16}$ $cm^{-3}$ and thickness is approximately 4 µm is epitaxially grown on the main surface of the high concentration n-type drain region 1. Then, boron ions as p-type impurities are implanted in an upper region of the low concentration n-type drain region 2 under the conditions of an implantation energy of 200 KeV and a dosage of $1 \times 10^{13}$ $cm^{-2}$, to form a low concentration p-type body region 3 on the low concentration n-type drain region 2. After that, a protection film 9 made of a silicon oxide film having a thickness of approximately 100 nm is formed on the low concentration p-type body region 3 by a thermal oxidation at a temperature of 1000° C. Herein, the low concentration p-type body region 3 may also be epitaxially grown using a CVD method, instead of being formed by the ion implantation.

Next, as shown in FIG. 3B, a resist is applied onto the protection film 9 to form, by photolithography, a resist pattern 10 which extends in a planar direction of the semiconductor substrate while forming a continuous concavo-convex shape. After that, the protection film 9 is removed by wet etching using the resist pattern 10 as a mask to transfer the pattern, which extends in a planar direction of the semiconductor substrate while forming a continuous concavo-convex shape, to the protection film 9.

Next, after removing the resist pattern 10 by ashing, a plurality of trenches T are formed by dry etching using the patterned protection film 9 as a mask as shown in FIG. 3C. Each trench T has a depth of approximately 1 µm though 3 µm and a width of approximately 0.3 µm and passes through the low concentration p-type body region 3 from a top face thereof to reach into the low concentration n-type drain region 2 of the n-type drain region 2a. The plurality of trenches T extend in a same direction, while forming a continuous concavo-convex shape when viewed from above. Herein, it is preferable to carry out the patterning such that a maximum distance between two adjacent trenches T of a region to be an n-type source region 4 is greater than a maximum distance between the two adjacent trenches T of a region to be a high concentration p-type body region 5 by approximately 50 nm or more.

Next, as shown in FIG. 4A, a sacrificial oxide film (not shown) having a thickness of approximately 30 nm is formed by thermal oxidation at a temperature of 1000° C. to minimize damage of an inner wall of the trench T, and the sacrificial oxide film is removed by wet etching. After that, a gate insulating film 6 made of a silicon oxide film having a thickness of approximately 10 nm though 80 nm is formed by a thermal oxidation method. Then, a polysilicon film (not shown) having a thickness of 400 nm is deposited in the trench T. N-type impurity ions are implanted into the polysilicon film and the polysilicon film is etched back to obtain a gate electrode 7 that is made of polysilicon and buried in the trench T. The thickness of the protection film 9 is reduced when, for example, the sacrificial oxide film is removed. The formation and removal of the sacrificial oxide film may be omitted.

In the step shown in FIG. 4B, a BPSG film is deposited and made to reflow by a thermal treatment at a temperature of, for example, 850° C. The BPSG film is etched back so that an insulating film 8 is formed on the gate electrode 7 in the trench T. Herein, the BPSG film may be subjected to CMP (Chemical Mechanical Polishing), instead of being etched back, to form the insulating film 8. Next, after an application of a resist, photolithography is carried out to form a resist pattern 11 which covers a region to be a high concentration p-type body region 5. As ions as n-type impurities are implanted in a source formation region that is located at an upper region of the low concentration p-type body region 3 using the resist pattern 11 as a mask under the conditions of an implantation energy of 100 KeV and a dosage of $5 \times 10^{15}$ cm$^{-2}$, to form an n-type source region 4.

In the step shown in FIG. 4C, the resist pattern 11 is removed by ashing and another resist is applied to form, by lithography, a resist pattern 12 which covers the n-type source region 4. Boron ions as p-type impurities are implanted in a high concentration body formation region that is located at an upper region of the low concentration p-type body region 3 using the resist pattern 12 as a mask under the conditions of an implantation energy of 50 KeV and a dosage of $5 \times 10^{15}$ cm$^{-2}$, to form a high concentration p-type body region 5. After that, the resist pattern 12 is removed by ashing and a thermal treatment at a temperature of 1000° C. is carried out for ten seconds for activation of the implanted impurities. Then, the protection film 9 is removed by wet etching. After the removal of the protection film 9, a silicide region may be formed on the n-type source region 4 and the high concentration p-type body region 5. N-type impurity ions may be implanted in the entire surface of the substrate to form the n-type source region 4 throughout the substrate surface and thereafter the high concentration p-type body region 5 may be formed using the resist pattern 12, or p-type impurity ions may be implanted in the entire surface of the substrate to form the high concentration p-type body region 5 throughout the substrate surface and thereafter the n-type source region 4 may be formed using the resist pattern 11. Further, the step of forming the high concentration p-type body region 5 and the step of forming the n-type source region 4, shown in FIG. 4B and FIG. 4C, may be carried out after the step shown in FIG. 3A.

Although not shown in the drawings, a source electrode is formed on the n-type source region 4, high concentration p-type body region 5 and insulating film 8, and a drain electrode is formed on the reverse side of the high concentration n-type drain region 1. After that, an interconnect to be connected to an interlayer insulating film or a contact plug is formed using a known technique. The semiconductor device of the present embodiment which has the trench gate structure as shown in FIG. 1, FIG. 2A and FIG. 2B is formed in this way.

3. First Modification of First Embodiment

FIG. 5 is a plan view showing the first modification of the semiconductor device according to the first embodiment of the present invention. In FIG. 5, the same structural element as in the semiconductor device of the first embodiment is labeled with a same reference number.

A semiconductor device according to this modification has a trench T and a gate electrode 7 which have a shape different from that of the semiconductor device of the first embodiment shown in FIG. 1 when viewed from above, but other than that, the structural elements are the same.

As shown in FIG. 5, the trench T and the gate electrode 7 of this modification form a concavo-convex shape having an approximately right-angled corner when viewed from above. This structure also produce the same effect as in the first embodiment.

4. Second Modification of First Embodiment

FIG. 6 is a plan view showing the second modification of the semiconductor device according to the first embodiment. FIG. 7A and FIG. 7B show cross sections taken along the line VIIa-VIIa and the line VIIb-VIIb, respectively, of the semiconductor device shown in FIG. 6.

As shown in FIG. 6, FIG. 7A and FIG. 7B, the semiconductor device according to this modification has a structure in which a high concentration p-type body region 5 is arranged between n-type source regions 4 and in which the high concentration p-type body regions 5 arranged next to each other in the direction in which a gate electrode 7 extends are connected to each other via a part located between the n-type source regions 4. In other words, the n-type source regions 4 isolated from each other by the high concentration p-type body region 5 are formed in a source formation region, which is sandwiched between two adjacent trenches T, such that each of the n-type source regions 4 is adjacent to a corresponding one of the trenches T.

According to this structure, an area of the high concentration p-type body region 5 is greater than in the semiconductor device according to the first embodiment, and therefore, resistance of the high concentration p-type body region 5 is reduced. This leads to the reduction in resistance in a base region of a parasitic bipolar transistor. As a result, the parasitic bipolar transistor is prevented from being turned on and resistance to breakdown that is caused by a surge voltage is further increased.

Embodiment 2

FIG. 8 is a plan view showing a semiconductor device according to the second embodiment of the present invention.

The semiconductor device of the first embodiment has a structure in which a trench T is sandwiched between an n-type source region 4 and a high concentration p-type body region 5. However, in the semiconductor device of the present embodiment, a trench T is composed of a part that is sandwiched between n-type source regions 4 and a part that is sandwiched between high concentration p-type body regions 5, and a maximum width of the part that is sandwiched between the n-type source regions 4 is narrower than a maximum width of the part that is sandwiched between the high concentration p-type body regions 5.

According to the semiconductor device of the present embodiment, the width of the gate electrode 7 at the part that is sandwiched between the n-type source regions 4 is narrower than the width of the gate electrode 7 of the semiconductor device of the first embodiment. Hence, the width of the n-type source region is greater than that of the n-type source region of a conventional semiconductor device and a distance between trenches in the low concentration p-type body region 3 is increased. Due to this structure, the low concentration body region 3 is less influenced by a gate voltage and the electric potential of the low concentration p-type body region 3 during operation is prevented from being lowered. As a result, resistance to breakdown that is caused by a surge voltage is increased.

According to the structure of the present embodiment, the trenches T and the n-type source regions 4, as well as the trenches T and the high concentration p-type body regions 5 are arranged alternately to have a belt-like shape. It is therefore easy to form the structure and design the pattern.

The conductivity types of the semiconductor layers which compose the semiconductor devices of the above embodiments and the modifications may be all reversed. In addition, the structures of the present invention may be employed not only in a MOS transistor but also in an IGBT (Insulated Gate Bipolar Transistor).

Further, the shape of the trench can be anything as long as it is not a straight line but has a concavo-convex shape in a planar direction of the semiconductor substrate. For example, a trench forming a wavy line may be used. In addition, the trench may have a round corner when viewed from above.

The gate insulating film is not limited to an oxide film but may be a film including silicon and at least one of nitrogen and oxygen.

The gate electrode is not necessarily made of polysilicon. A metal gate which is silicided allover may be used as the gate electrode.

As described above, a semiconductor device of the present invention is useful as a power transistor used for a DC-DC converter and a load switch of electronics equipment.

What is claimed is:

1. A method for fabricating a semiconductor device, the method comprising the steps of:
   (a) forming a low concentration body region of a second conductivity type on a drain region of a first conductivity type;
   (b) forming a plurality of trenches which extend in a same direction and each of which forms a continuous concavo-convex shape when viewed from above and passes through the low concentration body region to reach into the drain region;
   (c) forming a gate electrode in each of the plurality of trenches; and
   (d) forming in an upper part of the low concentration body region a source region of a first conductivity type and a high concentration body region containing a second conductivity type impurity whose concentration is higher than that of the low concentration body region, wherein the source region and the high concentration body region are formed such that a maximum distance between two adjacent trenches of the source region is greater than a maximum distance between the two adjacent trenches of the high concentration body region.

2. The method of claim 1, wherein
in the step (d), the source region and the high concentration body region are arranged alternately in a direction in which the plurality of trenches extend, and each of the plurality of trenches is sandwiched between the source region and the high concentration body region.

3. The method of claim 1, wherein
in the step (d), each of the source region and the high concentration body region forms a belt-like shape and the source region and the high concentration body region are arranged alternately in a direction in which the plurality of trenches extend, and
each of the plurality of trenches is composed of a part that is sandwiched between the source regions and a part that is sandwiched between the high concentration body regions.

4. A semiconductor device comprising:
a drain region of a first conductivity type;
a low concentration body region of a second conductivity type formed on the drain region;
a source region of a first conductivity type formed on the low concentration body region;
a high concentration body region formed on the low concentration body region and containing a second conductivity type impurity whose concentration is higher than that of the low concentration body region;
a gate insulating film; and
a gate electrode formed on the gate insulating film,
wherein a plurality of trenches which extend in a same direction and each of which forms a continuous concavo-convex shape when viewed from above are formed from top faces of the source region and the high concentration body region and pass through the low concentration body region to reach into the drain region,
the gate insulating film covers an inner surface of each of the plurality of trenches;
the gate electrode is buried in each of the plurality of trenches, and
a maximum distance between two adjacent trenches of the source region is greater than a maximum distance between the two adjacent trenches of the high concentration body region.

5. The semiconductor device of claim 4, wherein
the source regions and the high concentration body regions are arranged alternately in a direction in which the plurality of trenches extend, and
each of the plurality of trenches is sandwiched between the source region and the high concentration body region.

6. The semiconductor device of claim 4, wherein
each of the source region and the high concentration body region forms a belt-like shape and the source region and the high concentration body region are arranged alternately in a direction in which the plurality of trenches extend, and
each of the plurality of trenches intersects with the source region and the high concentration body region and is composed of a part that is sandwiched between the source regions and a part that is sandwiched between the high concentration body regions.

7. The semiconductor device of claim 6, wherein
a maximum width of the part that is sandwiched between the source regions is narrower than a maximum width of the part that is sandwiched between the high concentration body regions.

8. The semiconductor device of claim 4, wherein
the high concentration body region is formed also in a region which passes through the source region in a direction in which the plurality of trenches extend when viewed from above, and
the high concentration body region extends in a direction in which the plurality of trenches extend.

* * * * *